(12) United States Patent
Manneschi

(10) Patent No.: US 12,041,712 B2
(45) Date of Patent: Jul. 16, 2024

(54) WIDEBAND ANTENNA, IN PARTICULAR FOR A MICROWAVE IMAGING SYSTEM

(71) Applicant: Alessandro Manneschi, Arezzo (IT)

(72) Inventor: Alessandro Manneschi, Arezzo (IT)

( * ) Notice: Subject to any disclaimer, the term of this patent is extended or adjusted under 35 U.S.C. 154(b) by 382 days.

(21) Appl. No.: 17/431,278

(22) PCT Filed: Feb. 18, 2020

(86) PCT No.: PCT/EP2020/054262
§ 371 (c)(1),
(2) Date: Aug. 16, 2021

(87) PCT Pub. No.: WO2020/169619
PCT Pub. Date: Aug. 27, 2020

(65) Prior Publication Data
US 2022/0132656 A1 Apr. 28, 2022

(30) Foreign Application Priority Data
Feb. 21, 2019 (FR) ........................ 1901784

(51) Int. Cl.
*H01Q 1/48* (2006.01)
*G01S 7/03* (2006.01)
(Continued)

(52) U.S. Cl.
CPC .............. *H05K 1/0245* (2013.01); *G01S 7/03* (2013.01); *G01S 13/89* (2013.01); *H01P 3/081* (2013.01);
(Continued)

(58) Field of Classification Search
CPC ............ H01Q 9/27; H01Q 1/38; H01Q 21/24; H01Q 21/061; H01Q 11/105; H01Q 9/065; H01Q 5/25
See application file for complete search history.

(56) References Cited

U.S. PATENT DOCUMENTS 4,630,064 A * 12/1986 Andrews ................. H01Q 9/27
343/895
5,313,216 A 5/1994 Wang et al.
(Continued)

FOREIGN PATENT DOCUMENTS

| CN | 106067590 A | 11/2016 |
| EP | 1196962 B1 | 4/2009 |
| WO | 2006051947 A1 | 5/2006 |

OTHER PUBLICATIONS

Written Opinion of The Searching Authority—PCT/EP2020/054262 (English Translation) (Year: 2020).*
(Continued)

*Primary Examiner* — Vibol Tan
(74) *Attorney, Agent, or Firm* — Lerner David LLP

(57) ABSTRACT

The present invention relates to an antenna structure that is integrated into a printed circuit (10) comprising two dielectric layers (52, 56) that have the same dielectric constant but different thicknesses, a balanced radiating element in a spiral (60) on the first face (51) of the first dielectric layer (52) and a power supply for the balanced antenna by a balanced two-wire line (70) which has the same impedance as the balanced antenna, characterized in that the balanced two-wire line (70) interconnects the balanced spiral antenna (60) to a pair of microstrip transmission lines (80) positioned on the second face (57) of the second layer (56), in which each microstrip line (80) is suitable for having an impedance that is equal to half of the two-wire transmission line (70), and in that, in correspondence with the balanced microstrip line (80) on the first face (55) of the second layer (56) corresponding to the second face (53) of the first layer (52), a ground plane is positioned (85) which determines, as a function of the thickness of the second dielectric layer (56)
(Continued)

Figure 1:
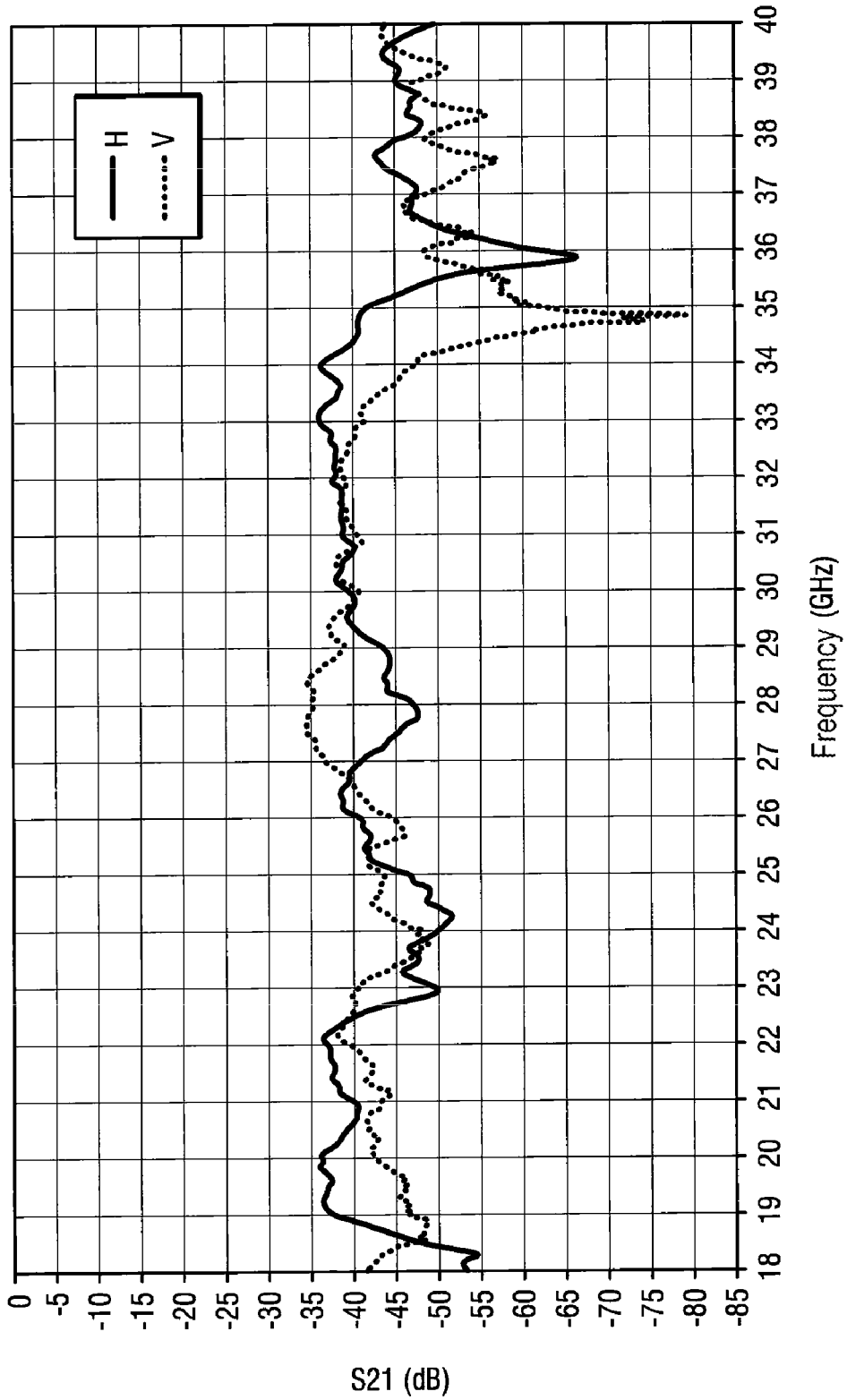

and the distance between the microstrips (80), the transmission impedance of the balanced microstrip line.

14 Claims, 12 Drawing Sheets

(51) Int. Cl.
    *G01S 13/89*     (2006.01)
    *H01P 3/08*     (2006.01)
    *H01Q 9/27*     (2006.01)
    *H05K 1/02*     (2006.01)

(52) U.S. Cl.
    CPC ............... *H01Q 1/48* (2013.01); *H01Q 9/27* (2013.01); *H05K 1/024* (2013.01); *H05K 2201/10151* (2013.01)

(56) References Cited

U.S. PATENT DOCUMENTS

| | | | |
|---|---|---|---|
| 6,067,058 A * | 5/2000 | Volman | H01Q 1/36 343/846 |
| 6,137,453 A | 10/2000 | Wang et al. | |
| 6,335,710 B1 * | 1/2002 | Falk | H01Q 3/44 343/753 |
| 6,407,721 B1 * | 6/2002 | Mehen | H01Q 1/36 343/895 |
| 6,975,281 B2 | 12/2005 | Neel | |
| 8,390,529 B1 * | 3/2013 | Paulsen | H01Q 11/105 343/895 |
| 11,495,886 B2 * | 11/2022 | Hong | H01Q 5/357 |
| 11,670,860 B1 * | 6/2023 | Cencich | H01Q 9/27 343/700 R |
| 11,799,205 B1 * | 10/2023 | Byers | H01Q 9/065 |
| 2005/0243013 A1 * | 11/2005 | Neel | H01Q 9/27 343/895 |
| 2007/0194978 A1 | 8/2007 | Teshirogi et al. | |
| 2008/0231541 A1 | 9/2008 | Teshirogi et al. | |
| 2017/0338551 A1 | 11/2017 | Rahman et al. | |

OTHER PUBLICATIONS

International Search Report for Application No. PCT/EP2020/054262 mailed Apr. 29, 2020. 4 pgs.

\* cited by examiner

WIDEBAND ANTENNA, IN PARTICULAR FOR A MICROWAVE IMAGING SYSTEM

CROSS-REFERENCE TO RELATED APPLICATIONS

The present application is a national phase entry under 35 U.S.C. § 371 of International Application No. PCT/EP2020/054262, filed Feb. 18, 2020, which claims priority from French Patent Application No. 1901784, filed Feb. 21, 2019, all of which are incorporated herein by reference.

SCOPE

The field of application of this invention is a wideband planar radiating structure, preferably working over a 15 GHz to 50 GHz frequency range, which can be used as a building block for the design of transmission/reception antenna arrays for microwave imaging systems.

PRIOR ART

A professor at Ohio State University (USA) in the early '50s and then at the University of Illinois from 1954 to 1957, Victor Rumsey developed a strong interest in the family of complementary antennas, namely those with an impedance that is constant and equal to half the free space impedance at all frequencies.

A feature of the self-complementary antenna is that its metallic part is congruent with the nonmetallic one, i.e. the second one can be superimposed on the first by a stiff movement in a plane or in space.

Many self-complementary geometries may be designed. Rumsey, after studying these structures for many years, established that the impedance and radiation properties are independent of frequency if the shape of the antenna is specified solely in terms of the angles. This law is known today as Rumsey's principle.

Rumsey's principle was applied experimentally by John Dyson at the University of Illinois who 1958 built the first spiral antenna with frequency-independent characteristics.

A type of complementary antenna, known as the two-arm Archimedean spiral, was perfected by Arthur Marston and Henri Coleman, of the US Navy, who equipped it with directional properties and patented the related solutions in 1958 and 1959 respectively.

More recently many methodologies for producing spiral antennas have been proposed and patented, for example in the U.S. Pat. Nos. 5,313,216 and 6,137,453.

U.S. Pat. No. 8,390,529 in particular shows a multilayer printed circuit board structure wherein the spiral antenna is positioned on the first surface of the first layer and a ground plane is positioned on the second face of the first layer (which also corresponds to the first face of the second layer). This ground plane represents the incorporation into the printed circuit of a conventional solution for making the radiation of the spiral antenna mono directional. A ground plane is also positioned on the second face of the second layer. This plane is used as a ground plane for the connection of a power supply system of the antenna, for example a shielding conductive braid for a coaxial cable.

This solution, even if it has the advantage of being incorporated into a printed circuit board, does not make it possible to obtain optimized wideband radiation characteristics, particularly in terms of impedance matching and transmission between a transmission antenna and a reception antenna. This limitation is caused by the resonances at the frequencies for which the thickness of the first layer is equivalent to a multiple of a quarter of the wavelength in the material constituting the layer itself.

The graph appended in FIG. 1 shows the frequency response (parameter S21) of an antenna compliant with the U.S. Pat. No. 8,390,529. The problems caused by the resonances and the lack of uniformity of the response can be seen.

A second problem of the structure shown in the U.S. Pat. No. 8,390,529 is the impossibility of using the second face of the second layer to realize transmission lines and to assemble hyperfrequency circuits since it is a ground plane used for connecting the power supply of the antenna.

Figure 2:
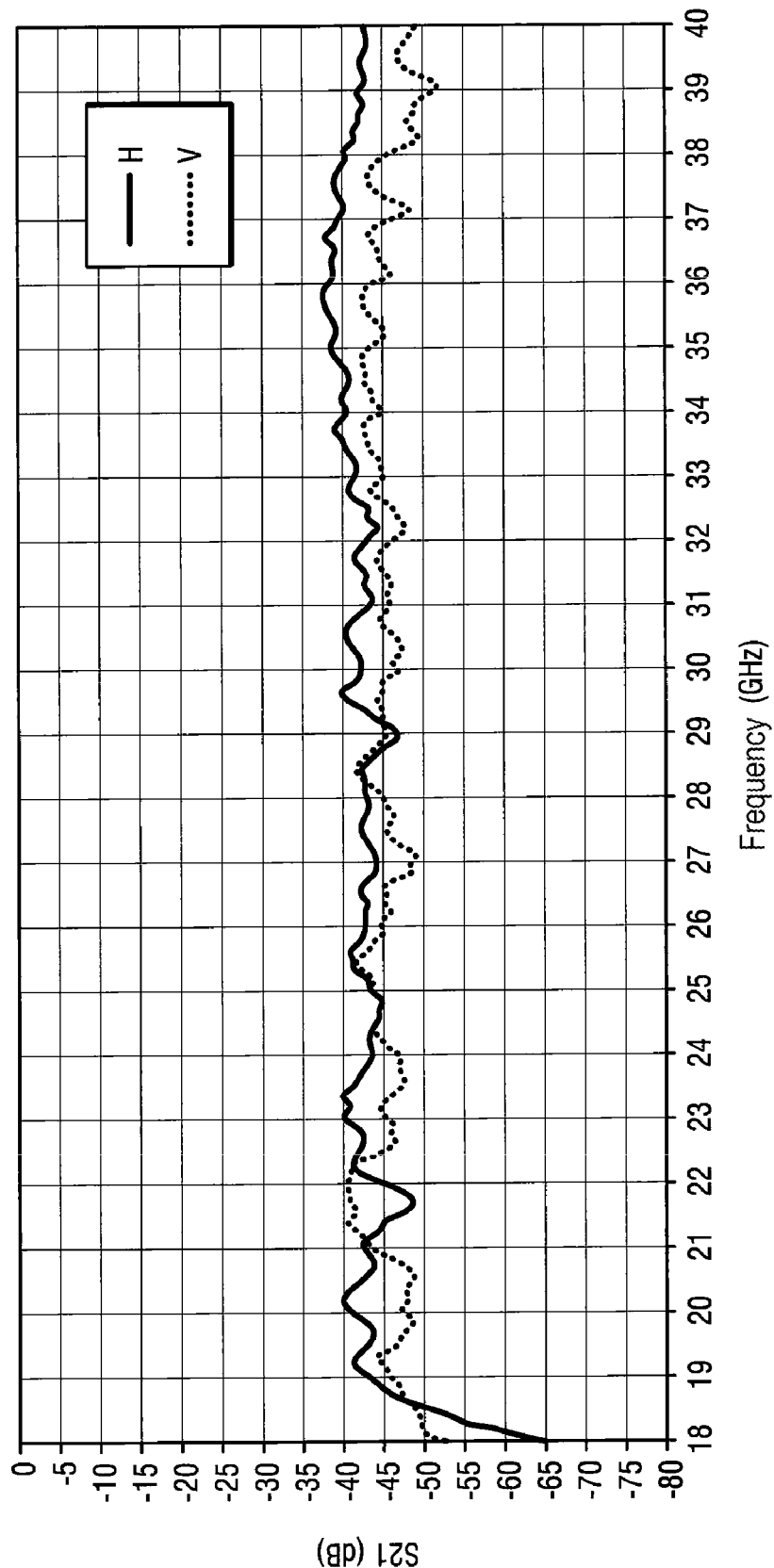

A third problem of the structure shown in the U.S. Pat. No. 8,390,529 is the coupling between the adjacent antennas, as shown in FIG. 2 of the same patent, caused by the possible passing of a part of the electromagnetic power through the dielectric material of the first layer. Consequently this solution is not appropriate for the construction of antenna arrays.

The document U.S. Pat. No. 6,335,710 describes an antenna structure successively comprising a spiral antenna placed between a layer of ferroelectric material, which can have a dielectric constant between 80 and 1500 and a layer of dielectric. However, such an antenna cannot be used in a wideband planar radiating structure with a view to its use in a microwave imaging system, insofar as it is a tunable antenna, which has a narrow frequency band. Specifically, the Q factor of this antenna is very high to make it possible to control the wave reflected off the layer of ferroelectric material.

DESCRIPTION OF THE INVENTION

The aim of the invention is to perfect the prior art by proposing an antenna which has properties superior to those of known antennas.

To do so the invention proposes an antenna structure and a printed circuit board in accordance with the appended independent claims. Embodiments are described in the dependent claims.

The invention consists in an antenna structure incorporated into a printed circuit board comprising two dielectric layers, having the same dielectric constant but different thicknesses (ha for the first layer—at least ⅛ of the maximum operating wavelength—and hTL for the second layer), a balanced spiral radiating element on the first face of the first dielectric layer and a power supply of the balanced antenna via a balanced two-wire line having the same impedance as the balanced antenna, characterized by the fact that the balanced two-wire line interconnects the balanced spiral antenna to a pair of microstrip transmission lines, positioned on the second face of the second layer, where each microstrip line is matched to have an impedance equal to half the impedance of the two-wire transmission line and by the fact that in alignment with the balanced microstrip line, on the first face of the second layer, equivalent to the second face of the first layer, a ground plane is positioned which determines, as a function of the thickness of the second dielectric layer and the distance between the microstrips, the transmission impedance of the balanced microstrip line.

Figure 3:
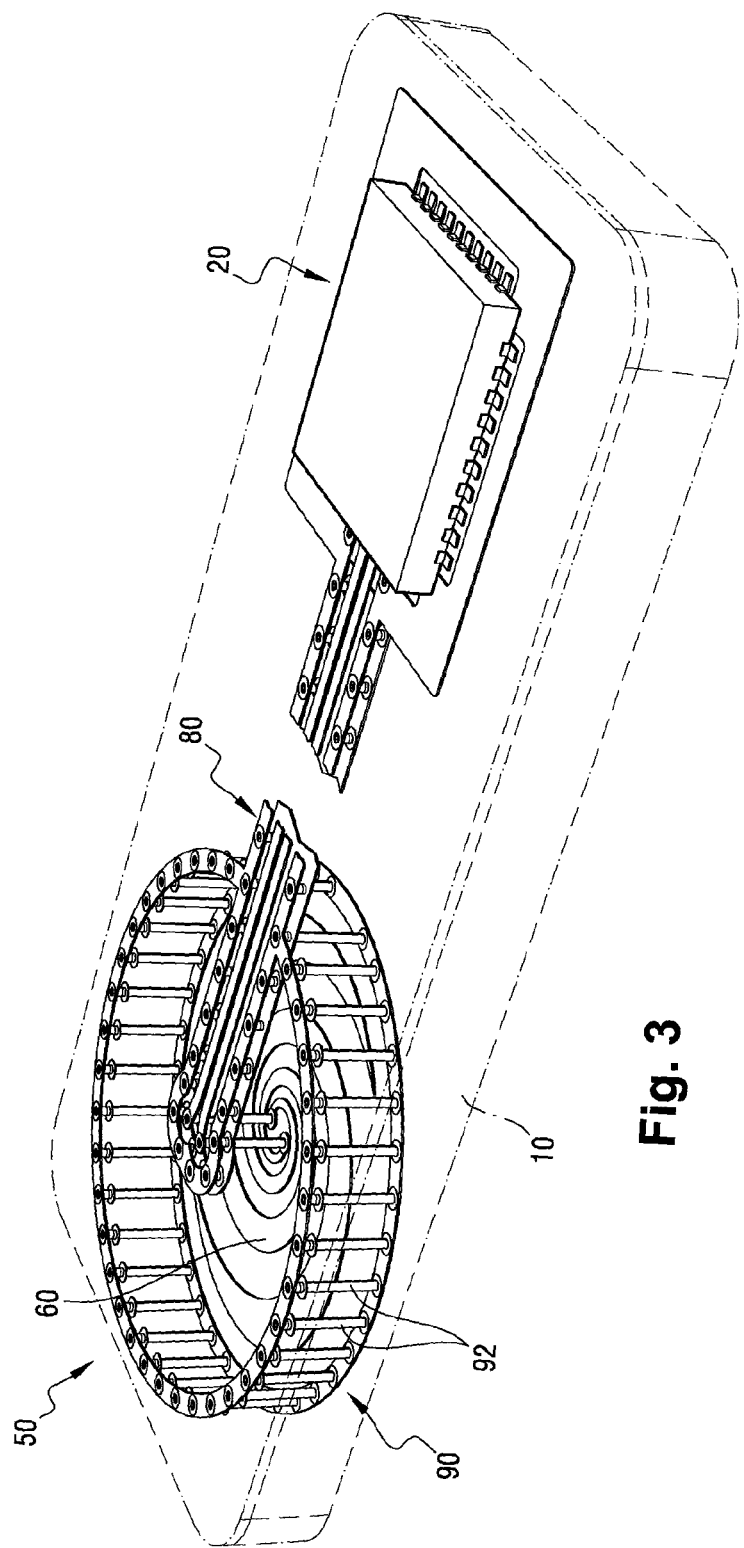
Figure 4:
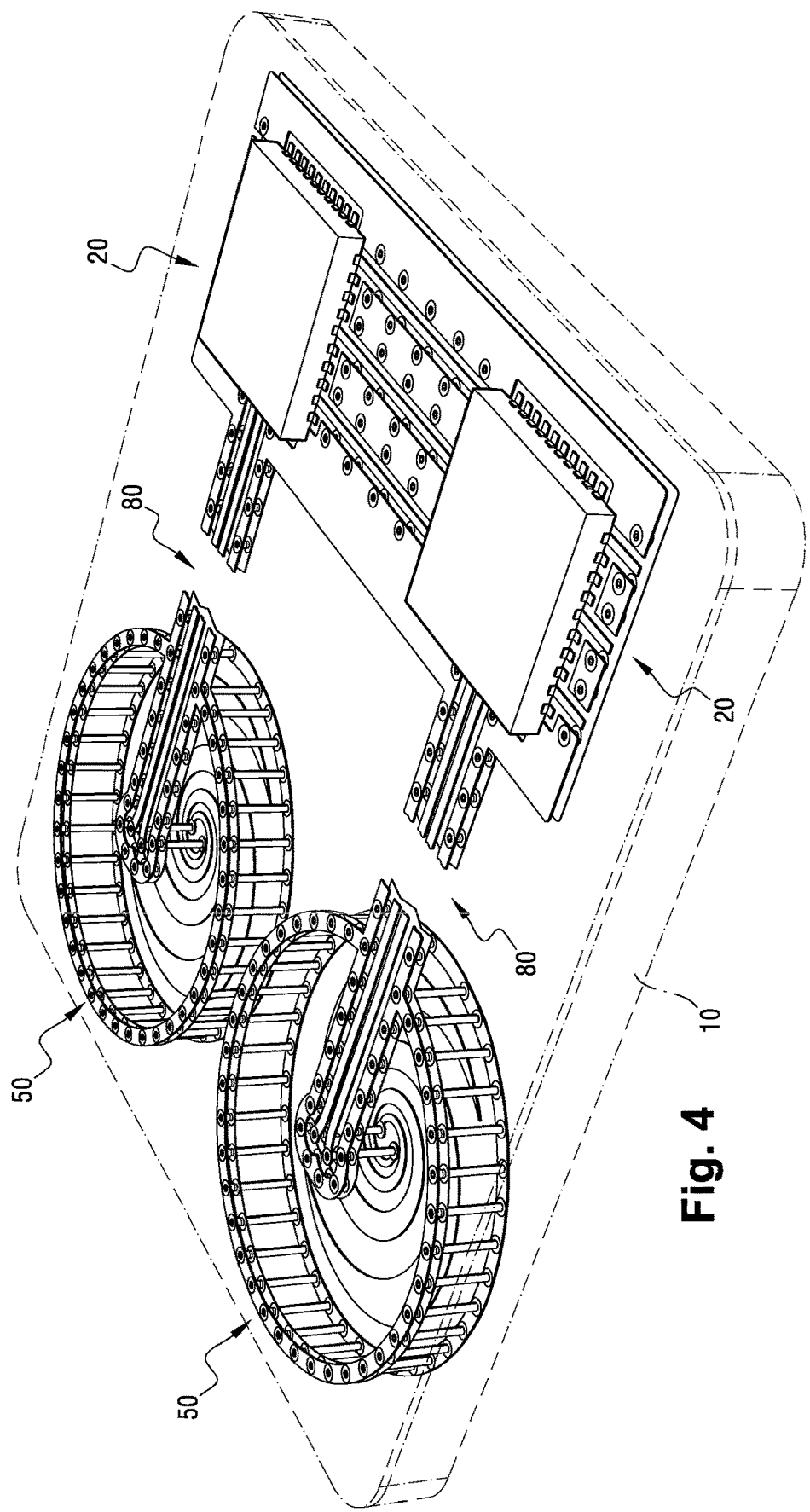
Figure 5:
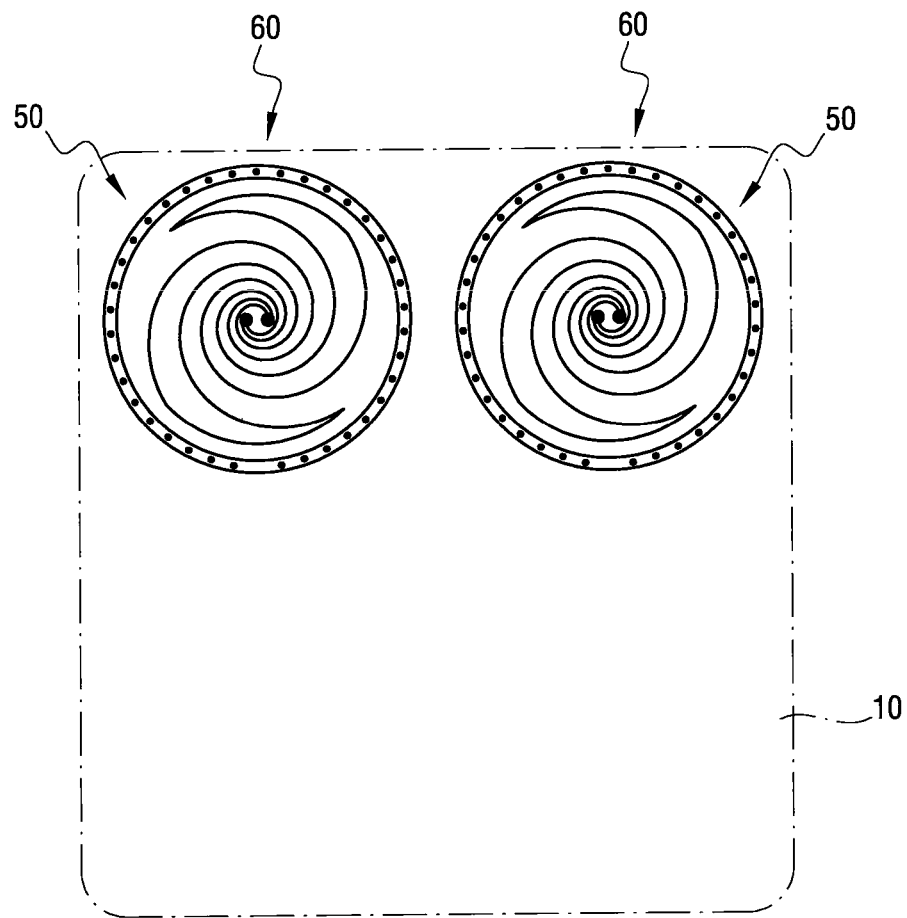
Figure 6:
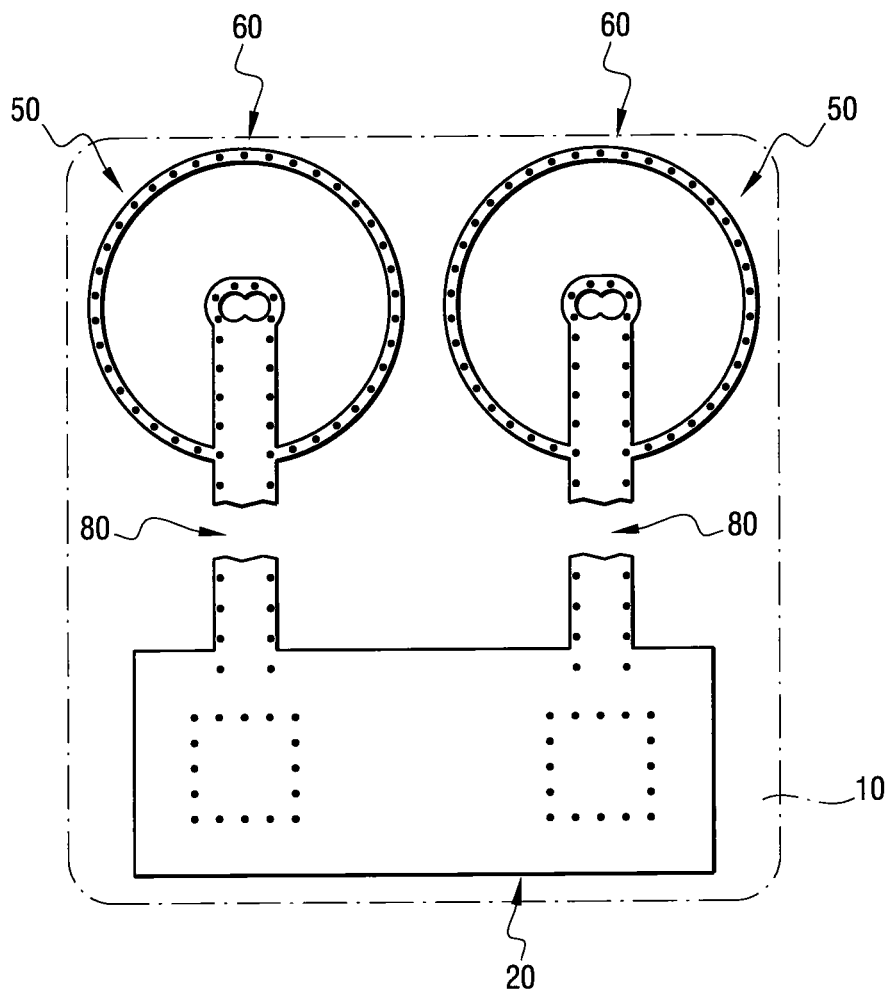
Figure 7:
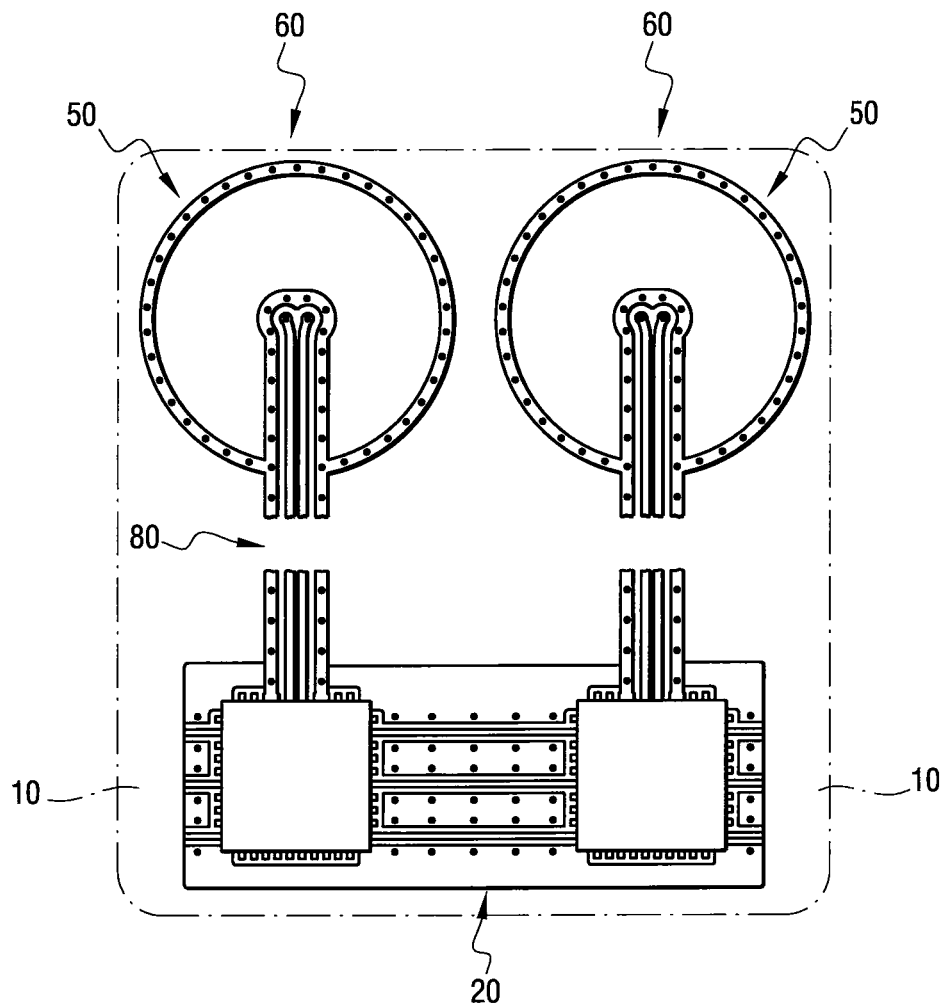
Figure 8:
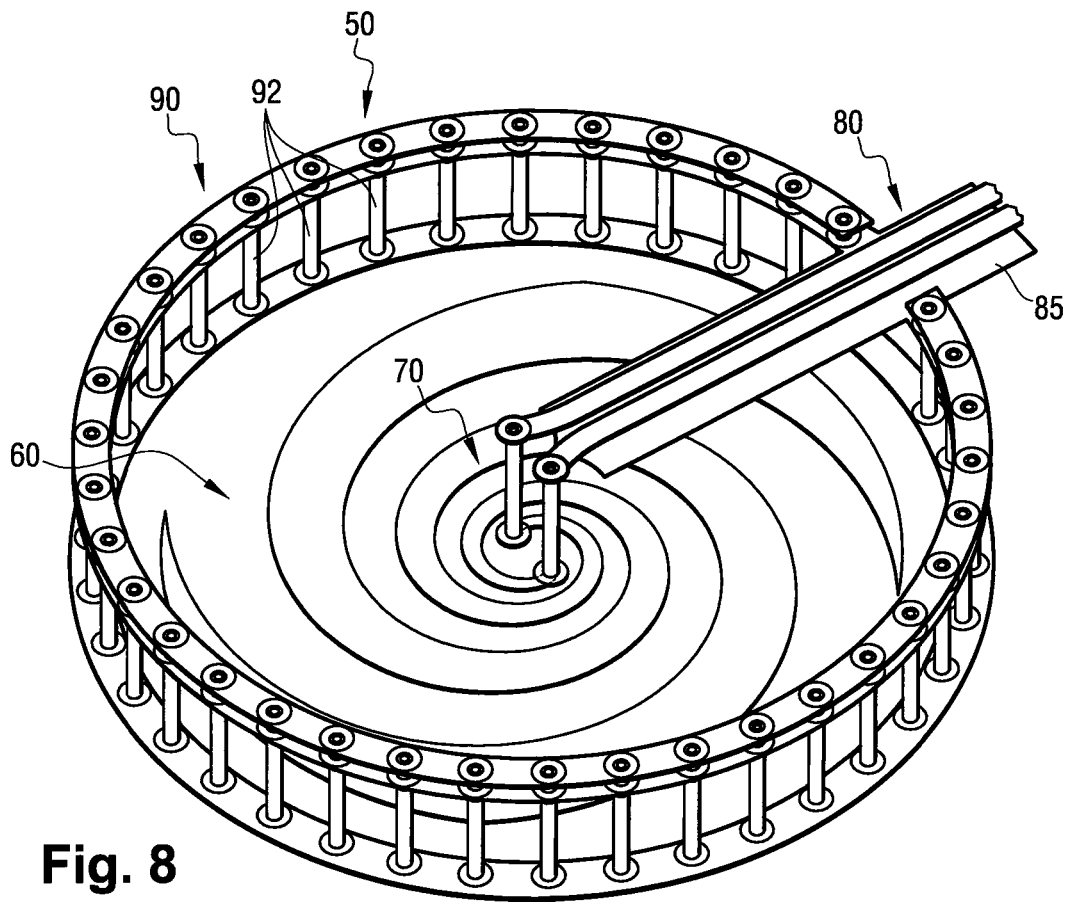

Other features, aims and advantages of this invention will become apparent on reading the following detailed description with reference to the appended drawings, given by way of nonlimiting example and wherein:

FIG. 1 shows the frequency response (parameter S21) of an antenna in accordance with the U.S. Pat. No. 8,390,529, FIG. 2 shows the frequency response (parameter S21) of an antenna in accordance with this invention, FIG. 3 shows an example of an installation of an antenna in accordance with this invention, associated with hyperfrequency components, installed on a common printed circuit board, FIG. 4 shows a variant of FIG. 3 and more precisely an example of an installation of two adjacent antennas in accordance with this invention, associated with respective hyperfrequency components, installed on a shared printed circuit board, FIG. 5 shows a balanced spiral antenna in accordance with this invention, on the first face of the first layer, FIG. 6 shows a view of the ground on the second face of the first layer (corresponding to the first face of the second layer) of an antenna in accordance with this invention, FIG. 7 shows the microstrip transmission lines connecting the antennas to hyperfrequency chips and the chips to one another, and FIGS. 8 to 17 show different perspective, plane or section views of the antenna in accordance with this invention.

DETAILED DESCRIPTION

On the appended figures an antenna 50 in accordance with this invention can be seen, incorporated into a printed circuit board 10.

The antenna 50 comprises two dielectric layers 52, 56. Each dielectric layer 52, 56 has a first face 51, 55, or upper face, and a second face 53, 57, or lower face, which is opposite the first face 51, 55. The second face 53 of the first layer 52 is positioned facing the first face 55 of the second layer 56.

The two dielectric layers 52, 56, have the same dielectric constant but different thicknesses. The thickness of the first layer 52 bears the reference ha. It is equal to at least ⅛ of the maximum operating wavelength. In this way, the thickness formed by the first dielectric layer 52 is not resonant and the antenna 50 can operate at wideband frequencies.

In an of embodiment, in order to limit the overall dimensions of the antenna structure, the thickness ha of the first layer 52 is less than or equal to half the maximum operating wavelength. This gives:

$$\frac{\lambda_{max}}{8} \leq h_a \leq \frac{\lambda_{max}}{2}$$

where $\lambda_{max}$ is the maximum operating wavelength.

For example, the thickness ha of the first dielectric layer 52 is equal to a quarter of the maximum operating wavelength (¼ $\lambda_{max}$).

The thickness of the second layer 56 bears the reference hTL.

The first layer 52 and the second layer 56 can be made of any suitable dielectric material, particularly any dielectric material able to be used to produce a printed circuit board. Their dielectric constant $\varepsilon_r$ is also low to guarantee that the antenna structure radiates and the energy does not remain confined in the first layer 52. For example, the dielectric material of the first and second layer 52, 56 can have a dielectric constant $\varepsilon_r$ greater than or equal to 2 and less than or equal to 4.

The antenna 50 further comprises a balanced spiral radiating element 60 on the first face 51 of the first dielectric layer 52 and a power supply of the balanced antenna 50 via a balanced two-wire line 70 having the same impedance as the balanced radiating element 50.

In an embodiment, the radiating element 60 comprises two symmetrical arms 61, 62. The arms 61 and 62 gradually diverge from the center of the antenna 50, where they are connected to the power supply, toward its circumference. The invention is not limited to the particular embodiment illustrated in the appended figures, either as to the geometry of each arm of the antenna or the number of arms.

The balanced two-wire line 70 interconnects the balanced spiral radiating element 50 to a pair of microstrip transmission lines 80, positioned on the second face 57 of the second layer 56. Each microstrip line 80 is matched to have an impedance equal to half the impedance of the two-wire transmission line 70. Aligned with the balanced microstrip line 80, on the first face 55 of the second layer 56, corresponding to the second face 53 of the first layer 52, is positioned a ground plane 85 which determines, as a function of the thickness hTL of the second dielectric layer 56 and the distance gTL between the microstrips, the transmission impedance of the balanced microstrip line 80.

In an embodiment, the thickness hTL of the second layer 56 is strictly less than the thickness ha of the first layer 52. Indeed, as has been specified above, the thickness ha of the first layer is at least equal to $\lambda_{max}/8$ in order to allow the radiation of the antenna structure. Moreover, the thickness hTL of the second layer is determined by the dimensions of the microstrip transmission lines 80 and particularly their thickness. However, insofar as microstrip transmission lines of reasonable thickness are preferred, the thickness hTL remains small and in any case less than the thickness ha of the first layer.

Figure 9:
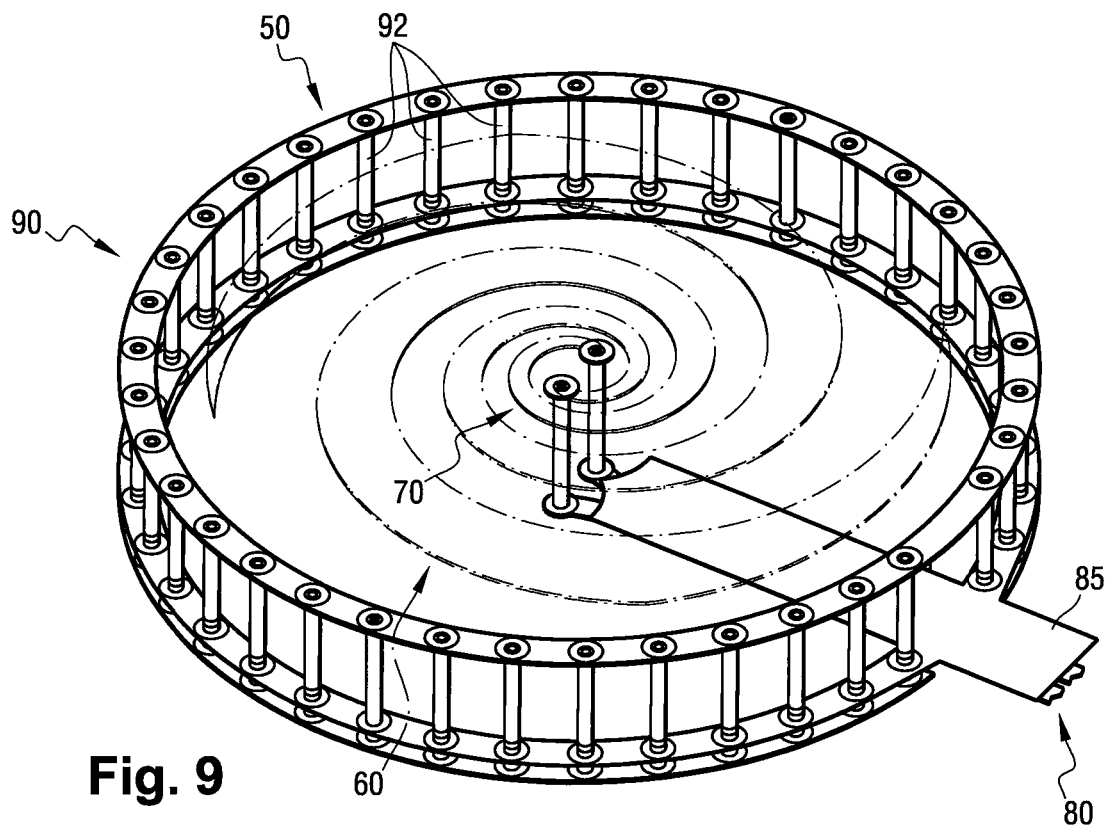
Figure 10:
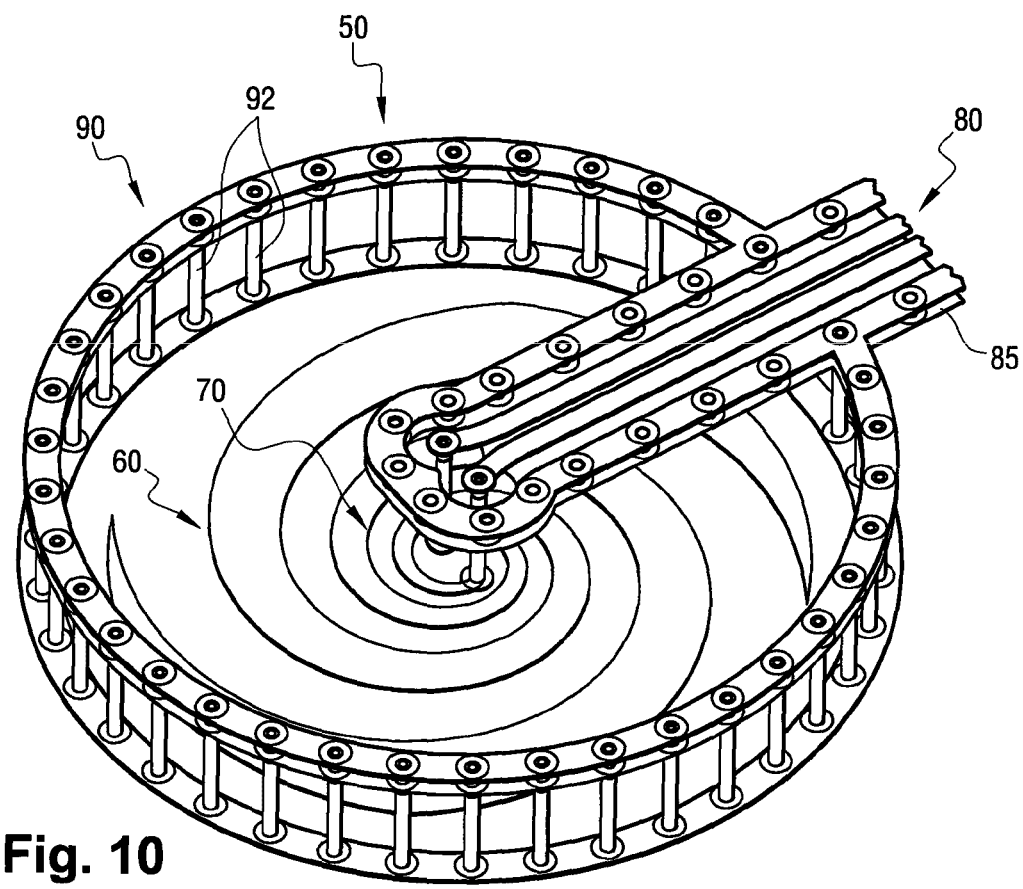
Figure 11:
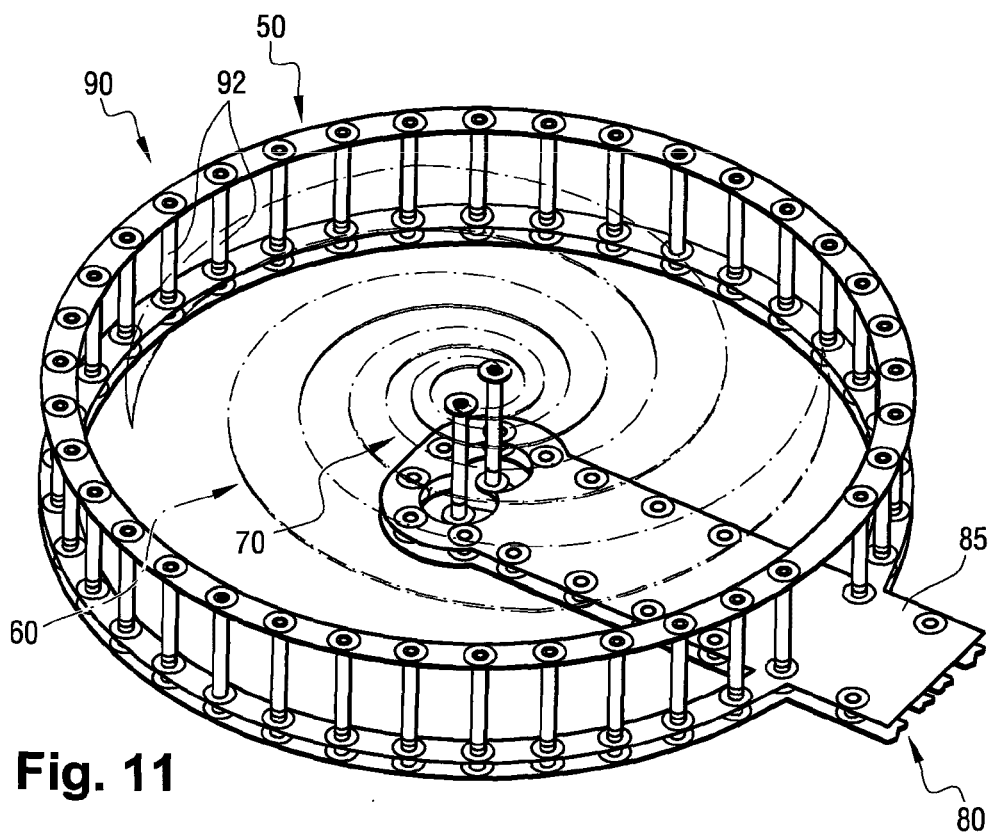
Figure 12:
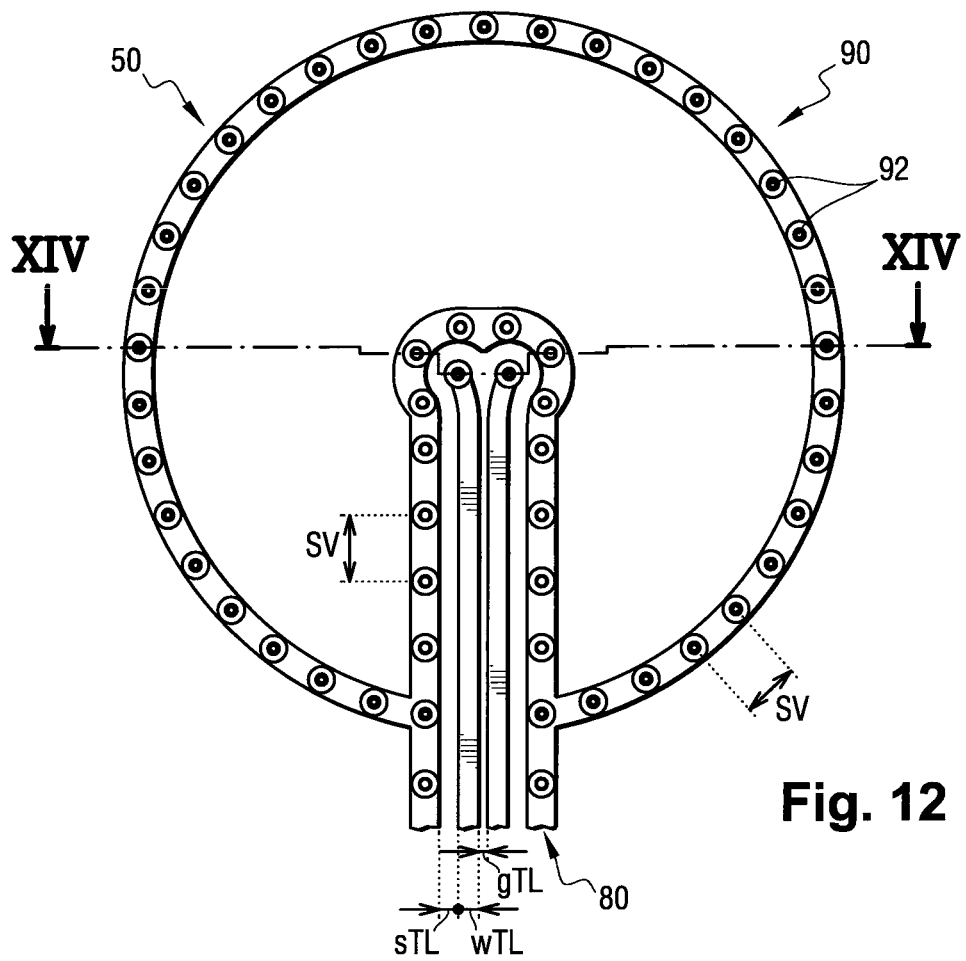
Figure 13:
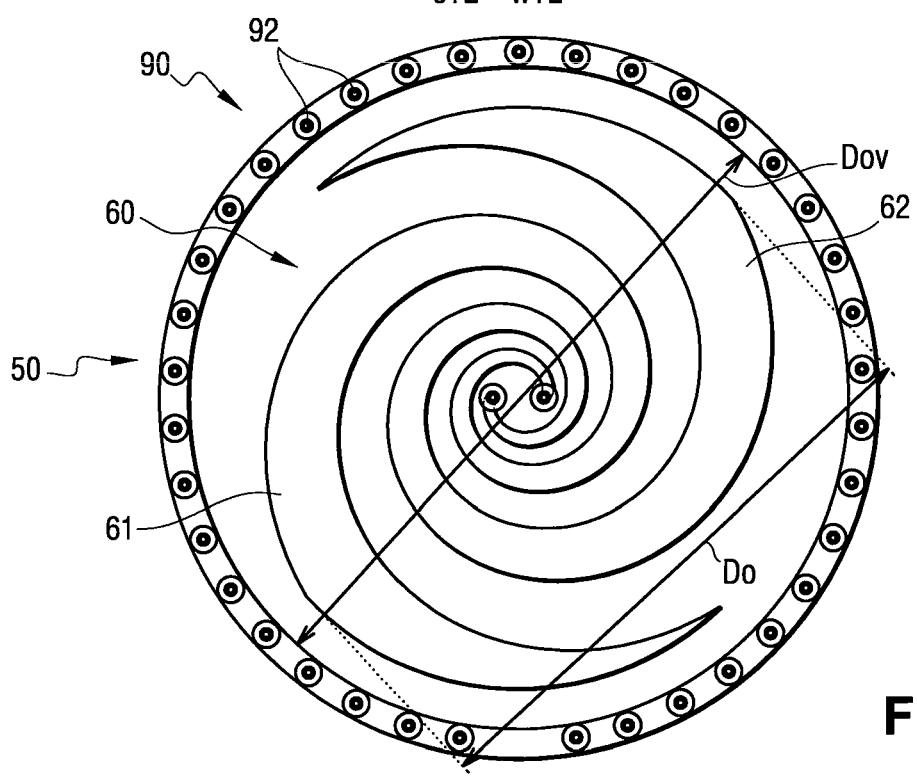
Figure 14:
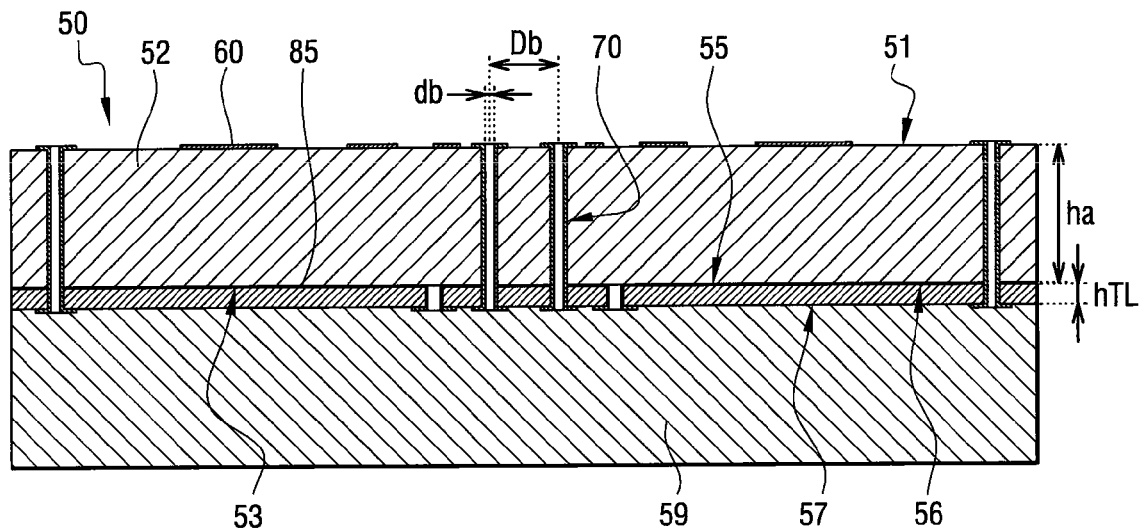
Figure 15:
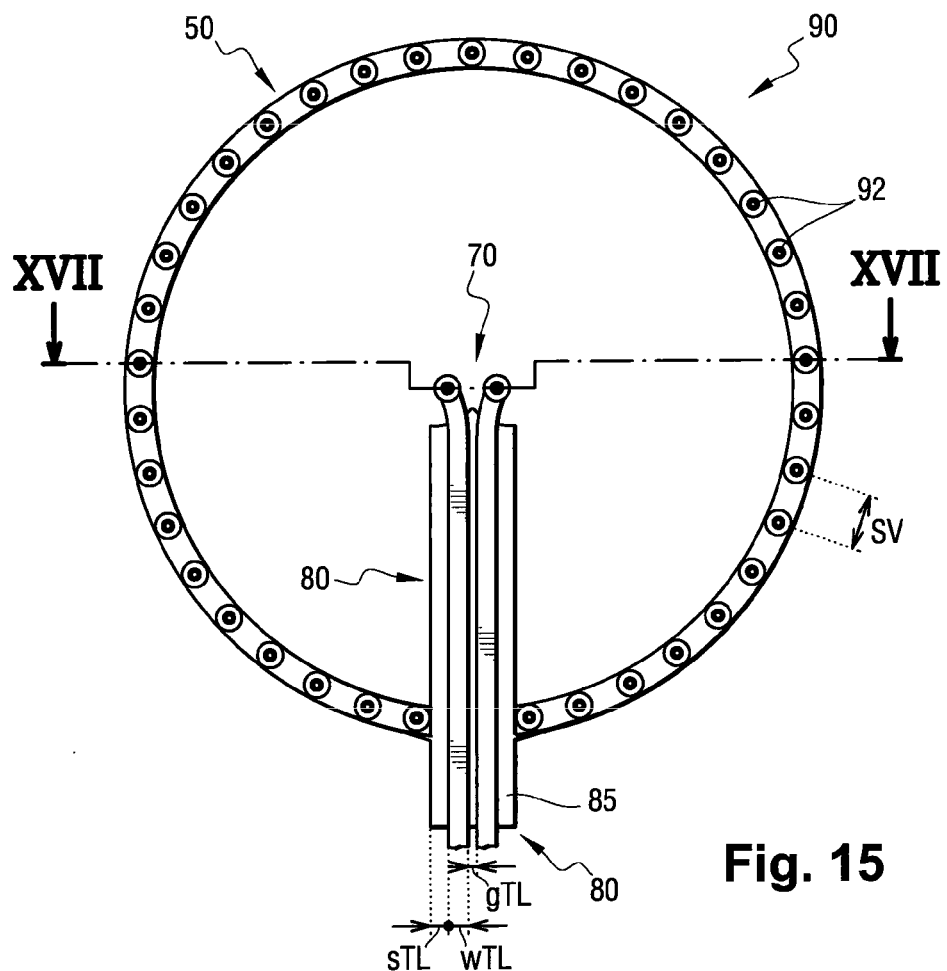
Figure 16:
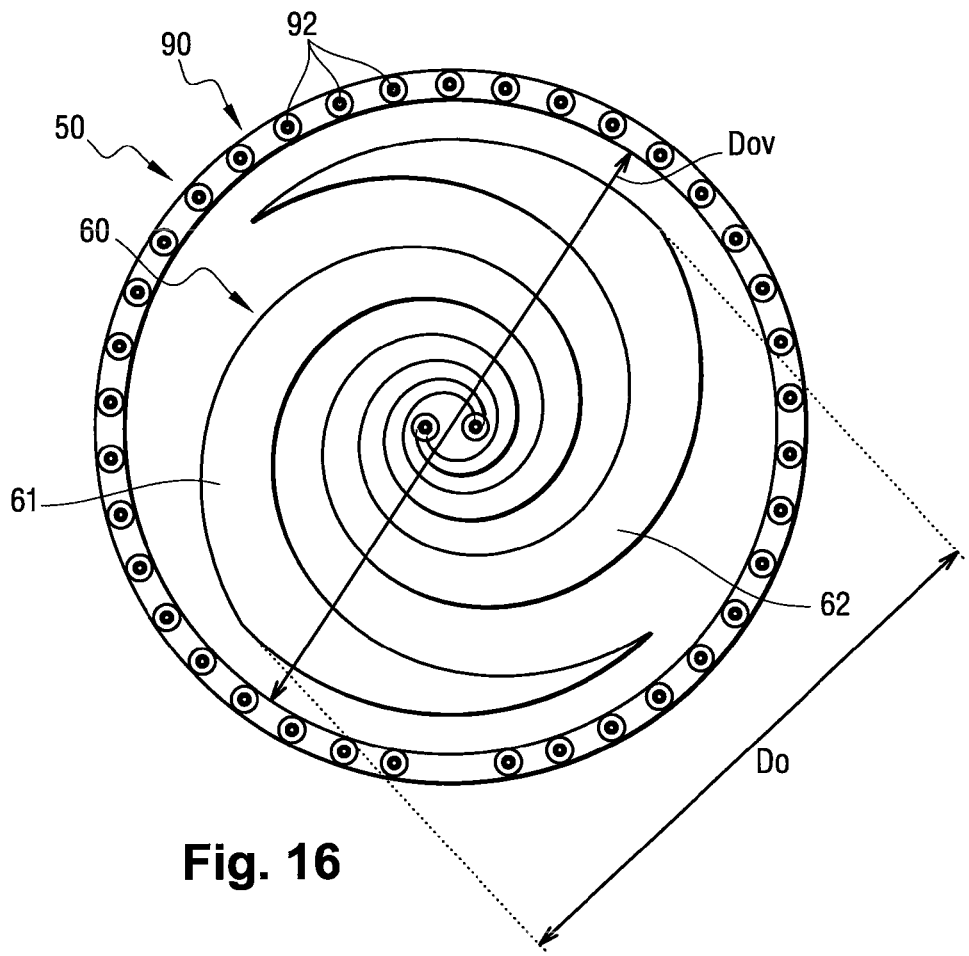
Figure 17:
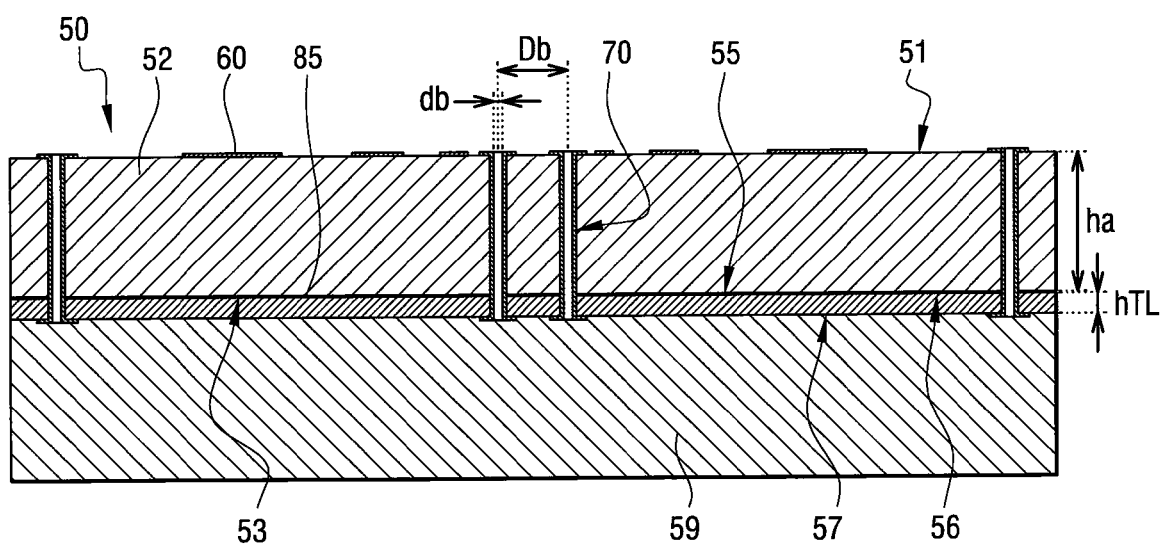

In addition, as can be seen for example in FIGS. 9 and 11, the balanced two-wire line is not connected to the ground plane 85. More precisely, the ground plane 85 has, in proximity to the wires of the balanced two-wire line 70, substantially circular apertures, the diameter of which is greater than the diameter of each wire of the line 70, such that the ground plane 85 extends at a distance from said wires.

In an embodiment, the connecting part of the microstrip lines 80, which is configured to be connected to the power supply and which extends substantially parallel to the ground plane 85, slightly diverges in proximity to the wires of the balanced two-wire line 70 (which extend substantially perpendicularly and at a distance from the ground plane 85) such that each line 80 is aligned with an associated wire of the balanced two-wire line 70. This configuration of the connection part of the microstrip lines 80 thus allows a gentle matching of the impedance between the microstrip lines 80 and the balanced two-wire line 70, improves power transfer and eliminates power reflections.

In an embodiment, the impedance $Z_{ant}$ of the spiral radiating element 60 between the power supply points of the arms 61 and 62 of the spiral radiating element 60 is configured to be substantially equal to 100Ω (to the nearest 20%). Moreover, the balanced two-wire line 70 has an impedance, between its wires, substantially equal to the impedance $Z_{ant}$ of the spiral radiating element 60, i.e. approximately 100Ω (to the nearest 20%). The impedance of each microstrip transmission line 80 is moreover chosen such that each line has an impedance with respect to the ground equal to approximately 50Ω such that the impedance between the lines 80 is equal to approximately 100Ω (to the nearest 20%). Owing to this configuration, it is possible to directly assemble hyperfrequency components 20 (for which the balanced impedance of the inputs and outputs is, in most cases, equal to approximately 100Ω) on the same layer as the microstrip lines 80 (i.e. on the second face 57 of the second layer 56), without requiring the addition of an intermediate matching component such as a balun (balanced-unbalanced) element between the component 20 and the microstrip transmission lines 80. This direct connection is particularly visible in FIG. 7, which illustrates a hyperfrequency component directly assembled on the antenna structure, without requiring the addition of a matching circuit or an external line comprising a balun. Since the balun is a very bulky and expensive component, this removal has the advantage of drastically reducing the overall dimensions and cost of the antenna structure.

The spiral radiating element 50 is surrounded by a wall 90 composed of vertical metallic connections 92, with a pitch sv between the connections 92 that is ¼ less than the minimum working wavelength in order to obtain effective shielding capable of containing the microwave field:

$$sv < \frac{\lambda_{min}}{4}$$

In the case of an antenna 50 with divergent arms 61, 62, the wall 90 can be of substantially circular shape.

Since the spiral radiating element 60 forms an electric dipole, the curvilinear length of the arms 61, 62 is preferably substantially equal to half the maximum operating wavelength $\lambda_{max}$, such that the current is zero at the outer end of the wires 61, 62. The wall 90 is therefore dimensioned such that the maximum diameter Do of the spiral radiating element 60 is between 0.5 and 1.5 times the maximum wavelength: $0.75\lambda_{max} \leq D_o \leq 1.5\lambda_{max}$ In addition, the Applicant has empirically (experimentally) determined that, to limit the area of radiation of the microwave field while limiting the influence of the wall 90 on the impedance of the spiral radiating element, the mean inner diameter $D_{ov}$ of the wall complies with the following equation:

$$(D_o + 0.005\lambda_{max}) \leq D_{ov} \leq (D_o + 0.25\lambda_{max})$$

In a form of embodiment, the entire second face 57 of the second dielectric layer 56 (except for the surface around the microstrip transmission line 80 and its connection to the balanced two-wire line 70) is covered by a layer 59 of radio frequency-absorbent material to make the radiation diagram of the antenna mono-directional without incurring any resonance phenomena. In a form of embodiment, the absorbent material of the layer 59 may comprise a material absorbing a wide spectrum of millimeter waves and/or a material absorbing high-loss elastomer microwaves. This layer 90 makes it possible to uncouple adjacent antennas, thus keeping to a minimum the power transfer between the same antennas.

The design parameters of the antenna are as follows:

$$0.75\lambda_{max} \leq D_o \leq 1.5\lambda_{max}$$

$$\frac{\lambda_{max}}{8} \leq h_a \leq \frac{\lambda_{max}}{2}$$

$$(D_o + 0.005\lambda_{max}) \leq D_o \leq (D_o + 0.25\lambda_{max})$$

-continued $$sv < \frac{\lambda_{min}}{4}$$

$$Z_{ant} = \frac{120\pi}{2\sqrt{\varepsilon_{eff}}} \text{ where } \varepsilon_{eff} = \frac{\varepsilon_r + 1}{2}$$

Where: $D_o$ shows the outer diameter of the radiating element, i.e. its maximum diameter.

$D_{ov}$ shows the mean inner diameter of the wall 90.

$Z_{ant}$ shows the impedance of the spiral radiating element 60

$\varepsilon_{eff}$ shows the effective dielectric constant of the spiral radiating element 60

$\varepsilon_r$ shows the dielectric constant of the first layer 52.

For example, for an antenna structure with a first layer 52 having a dielectric constant $\varepsilon_r$ equal to 3, an impedance for the spiral radiating element 60 equal to approximately 135Ω is obtained.

The antenna structure in accordance with this structure according to the invention has many advantages:
- Optimum impedance matching characteristics over the whole working frequency range.
- Frequency response uniform and constant over the whole working range (see graph shown in FIG. 2)
- Strong uncoupling between adjacent antennas
- Suitable for incorporation on the same printed circuit board on which hyperfrequency components 20 are mounted, offering great economy of production (FIG. 7).

According to another advantageous feature of the invention, the thickness of the first layer is less than half the maximum operating wavelength.

The invention claimed is:

1. An antenna structure comprising:
a first and a second dielectric layer, wherein a dielectric constant of the first dielectric layer is equal to a dielectric constant of the second dielectric layer and a thickness of the first dielectric layer is different from to a thickness of the second dielectric layer, the first and second dielectric layers each having a first face and a second face;
a balanced spiral radiating element on the first face of the first dielectric layer;
a power supply configured to supply power to the balanced spiral radiating antenna via a balanced two-wire line, wherein an impedance of the balanced two-wire line is equal to an impedance of the balanced spiral radiating element, and wherein the balanced two-wire line interconnects the balanced spiral radiating antenna with a pair of balanced microstrip transmission lines positioned on the second face of the second dielectric layer, wherein each microstrip transmission line is adapted to have an impedance equal to half the impedance of the two-wire transmission line; and
a ground plane positioned on the first face of the second dielectric layer and on the second face of the first dielectric layer, the ground plane being aligned with the balanced microstrip lines and being configured to determine, as a function of the thickness of the second dielectric layer and a distance between wires of the balanced two-wire line, a transmission impedance of the balanced microstrip transmission lines.

2. The antenna structure of in claim 1, wherein the dielectric constant of the first layer and of the second layer is greater than or equal to 2 and less than or equal to 4.

3. The antenna structure of claim 1, wherein the balanced spiral radiating element is surrounded by a wall comprising vertical metallic connections.

4. The antenna structure of claim 3, wherein a pitch between the vertical metallic connections is less than ¼ of a minimum working wavelength of the balanced spiral radiating element.

5. The antenna structure of claim 3, wherein a mean inner diameter of the wall is defined as a function of a maximum diameter of the balanced spiral radiating element as per the following equation:

$$(D_o+0.005\ \lambda_{max}) \leq D_{ov} \leq (D_o+0.25\ \lambda_{max})$$

where $D_{ov}$ represents the mean inner diameter of the wall $D_o$ represents the maximum outer diameter of the balanced spiral radiating element.

6. The antenna structure of claim 1, wherein all of the second face of the second dielectric layer, around the balanced microstrip transmission line and the connection of the balanced microstrip transmission line to the balanced two-wire line, is covered by a layer of radio frequency-absorbent material.

7. The antenna structure of claim 1, wherein the thickness of the first layer is equal to at least ⅛ of a maximum operating wavelength of the balanced spiral radiating element.

8. The antenna structure of claim 1, wherein the thickness of the first layer is less than or equal to half a maximum operating wavelength of the balanced spiral radiating element.

9. The antenna structure of claim 1, wherein a maximum diameter of the balanced spiral radiating element is between 0.75 times and 1.5 times a maximum operating wavelength of the balanced spiral radiating element:

$$0.75\lambda_{max} \leq D_o \leq 1.5\lambda_{max}$$

where: $D_o$ represents the maximum outer diameter of the balanced radiating element; and $\lambda_{max}$ represents the maximum operating wavelength of the balanced spiral radiating element.

10. A printed circuit board comprising:
an antenna structure comprising:
a first and a second dielectric layer, wherein a dielectric constant of the first dielectric layer is equal to a dielectric constant of the second dielectric layer and a thickness of the first dielectric layer is different from to a thickness of the second dielectric layer, the first and second dielectric layers each having a first face and a second face;
a balanced spiral radiating element on the first face of the first dielectric layer;
a power supply configured to supply power to the balanced spiral radiating antenna via a balanced two-wire line, wherein an impedance of the balanced two-wire line is equal to an impedance of the balanced spiral radiating element, and wherein the balanced two-wire line interconnects the balanced spiral radiating antenna with a pair of balanced microstrip transmission lines positioned on the second face of the second dielectric layer, wherein each microstrip transmission line is adapted to have an impedance equal to half the impedance of the two-wire transmission line; and
a ground plane positioned on the first face of the second dielectric layer and on the second face of the first dielectric layer, the ground plane being aligned with the balanced microstrip lines and being configured to determine, as a function of the thickness of the second dielectric layer and a distance between wires of the balanced two-wire line, a transmission impedance of the balanced microstrip transmission lines; and
a hyperfrequency component, directly connected to the balanced microstrip transmission lines.

11. The printed circuit board of claim 10, wherein the printed circuit board has no matching component between the balanced microstrip transmission lines and the hyperfrequency component.

12. The printed circuit board of claim 10, wherein:
balanced inputs and outputs of the hyperfrequency component have a predetermined impedance;
the balanced spiral radiating element and the balanced two-wire line have an impedance approximately equal to the predetermined impedance of the balanced inputs and outputs of the hyperfrequency component; and
each of the microstrip transmission lines has an impedance substantially equal to one half of the predetermined impedance of the balanced inputs and outputs of the hyperfrequency component.

13. The printed circuit board of claim 12, wherein the predetermined impedance of the balanced inputs and outputs of the hyperfrequency component is substantially equal to 100 Ω.

14. A microwave imaging system comprising at least one printed circuit board comprising:
an antenna structure comprising:
a first and a second dielectric layer, wherein a dielectric constant of the first dielectric layer is equal to a dielectric constant of the second dielectric layer and a thickness of the first dielectric layer is different from to a thickness of the second dielectric layer, the first and second dielectric layers each having a first face and a second face;
a balanced spiral radiating element on the first face of the first dielectric layer;
a power supply configured to supply power to the balanced spiral radiating antenna via a balanced two-wire line, wherein an impedance of the balanced two-wire line is equal to an impedance of the balanced spiral radiating element, and wherein the balanced two-wire line interconnects the balanced spiral radiating antenna with a pair of balanced microstrip transmission lines positioned on the second face of the second dielectric layer, wherein each microstrip transmission line is adapted to have an impedance equal to half the impedance of the two-wire transmission line; and
a ground plane positioned on the first face of the second dielectric layer and on the second face of the first dielectric layer, the ground plane being aligned with the balanced microstrip lines and being configured to determine, as a function of the thickness of the second dielectric layer and a distance between wires of the balanced two-wire line, a transmission impedance of the balanced microstrip transmission lines; and
a hyperfrequency component, directly connected to the balanced microstrip transmission lines.

* * * * *